United States Patent
Liao et al.

(10) Patent No.: US 12,051,727 B2
(45) Date of Patent: Jul. 30, 2024

(54) ACTIVE DEVICE SUBSTRATE

(71) Applicant: Au Optronics Corporation, Hsinchu (TW)

(72) Inventors: Po-Yung Liao, Hsinchu (TW); Yi-Da He, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 248 days.

(21) Appl. No.: 17/516,715

(22) Filed: Nov. 2, 2021

(65) Prior Publication Data

US 2023/0014890 A1    Jan. 19, 2023

(30) Foreign Application Priority Data

Jul. 13, 2021    (TW) .................. 110125759

(51) Int. Cl.
| | | |
|---|---|---|
| *H01L 29/40* | (2006.01) | |
| *H01L 27/12* | (2006.01) | |
| *H01L 29/417* | (2006.01) | |
| *H01L 29/786* | (2006.01) | |

(52) U.S. Cl.
CPC ........ *H01L 29/402* (2013.01); *H01L 27/1222* (2013.01); *H01L 27/1255* (2013.01); *H01L 29/41733* (2013.01); *H01L 29/78621* (2013.01); *H01L 29/78696* (2013.01)

(58) Field of Classification Search
CPC .............. H01L 29/402; H01L 27/1222; H01L 27/1255; H01L 29/41733; H01L 29/78621; H01L 29/78696; H01L 29/78624; H01L 29/786; H01L 29/40; H01L 29/41
See application file for complete search history.

(56) References Cited

U.S. PATENT DOCUMENTS

| | | | |
|---|---|---|---|
| 2012/0115288 A1 | 5/2012 | Sun et al. | |
| 2012/0280332 A1 | 11/2012 | You et al. | |
| 2018/0033808 A1* | 2/2018 | Li | ........... H01L 27/1222 |
| 2019/0051677 A1* | 2/2019 | Liu | ........... H01L 27/092 |

FOREIGN PATENT DOCUMENTS

| | | |
|---|---|---|
| CN | 100583417 | 1/2010 |
| CN | 102244037 | 9/2013 |
| CN | 203871327 | 10/2014 |
| EP | 2500941 | 9/2012 |
| TW | I264243 | 10/2006 |
| TW | 201915576 | 4/2019 |

* cited by examiner

*Primary Examiner* — Mohammed R Alam
(74) *Attorney, Agent, or Firm* — JCIPRNET

(57) ABSTRACT

An active device substrate includes a substrate, a first semiconductor layer, a gate insulating layer, a first gate, a first source, a first drain and a shielding electrode. The first semiconductor layer includes a first heavily doped region, a first lightly doped region, a channel region, a second lightly doped region, and a second heavily doped region that are sequentially connected. The first gate is located on the gate insulating layer and overlaps the channel region. The first source is electrically connected to the first heavily doped region. The first drain is electrically connected to the second heavily doped region. The shielding electrode overlaps the second lightly doped region in a normal direction of the substrate.

17 Claims, 10 Drawing Sheets

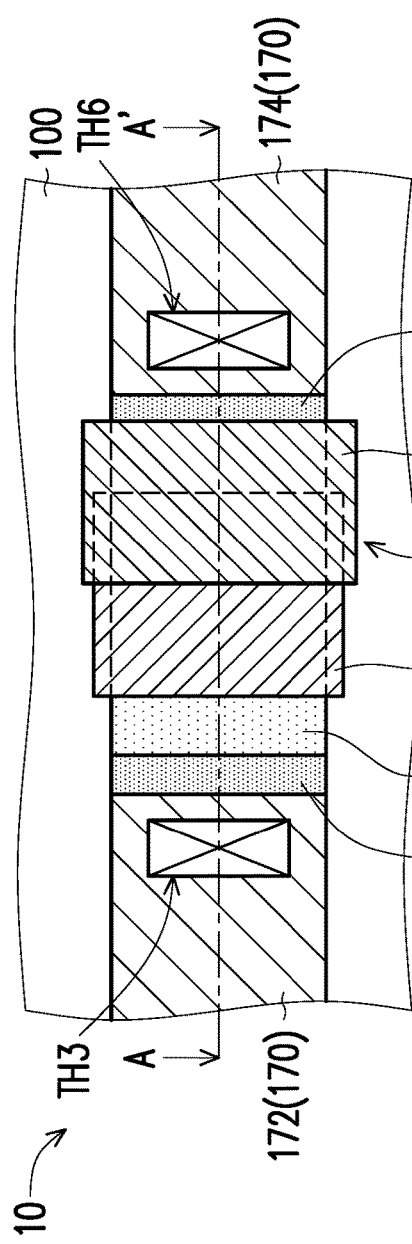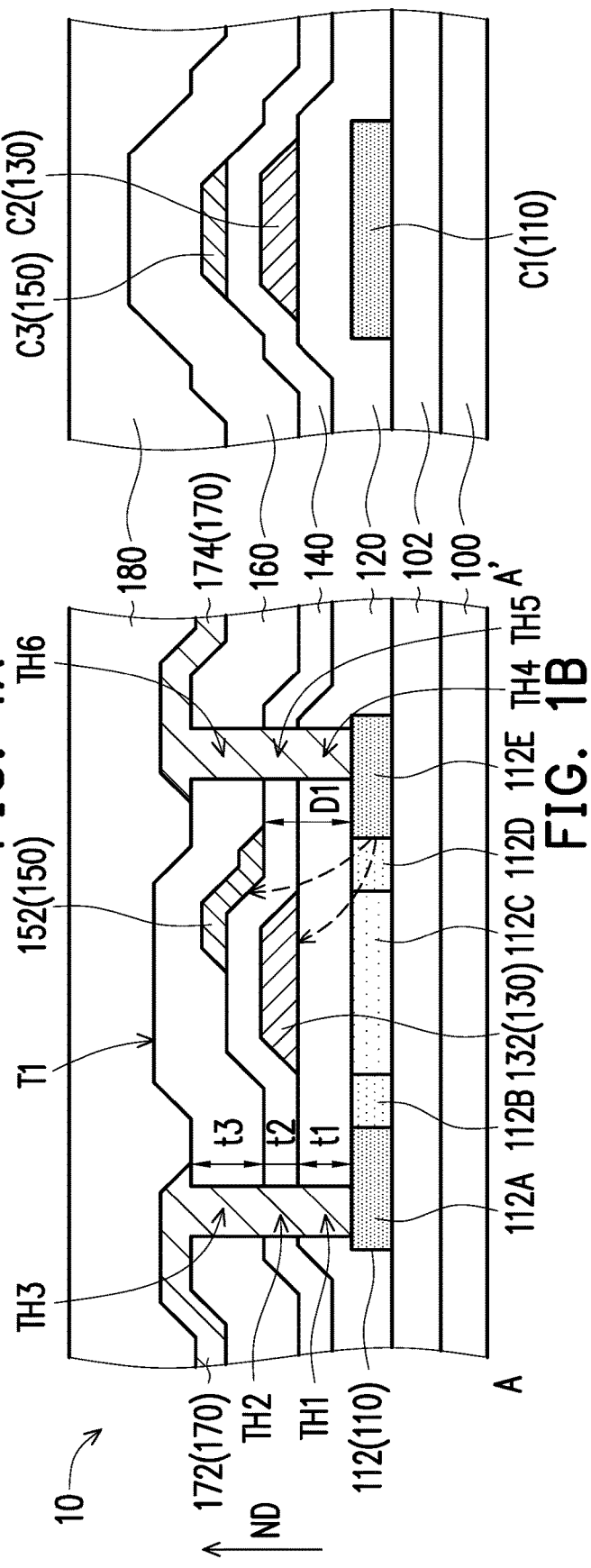
FIG. 1A
FIG. 1B

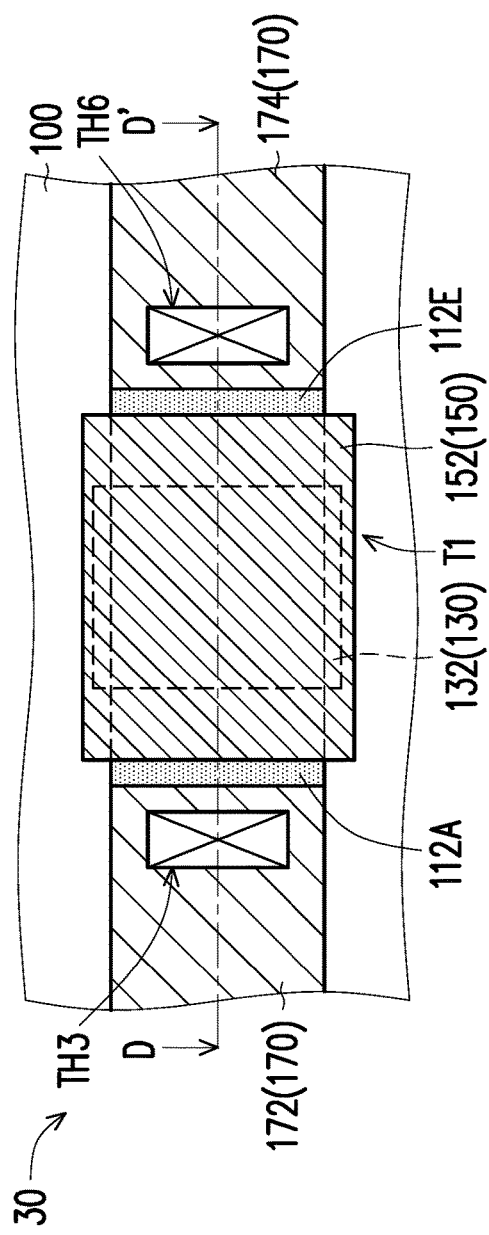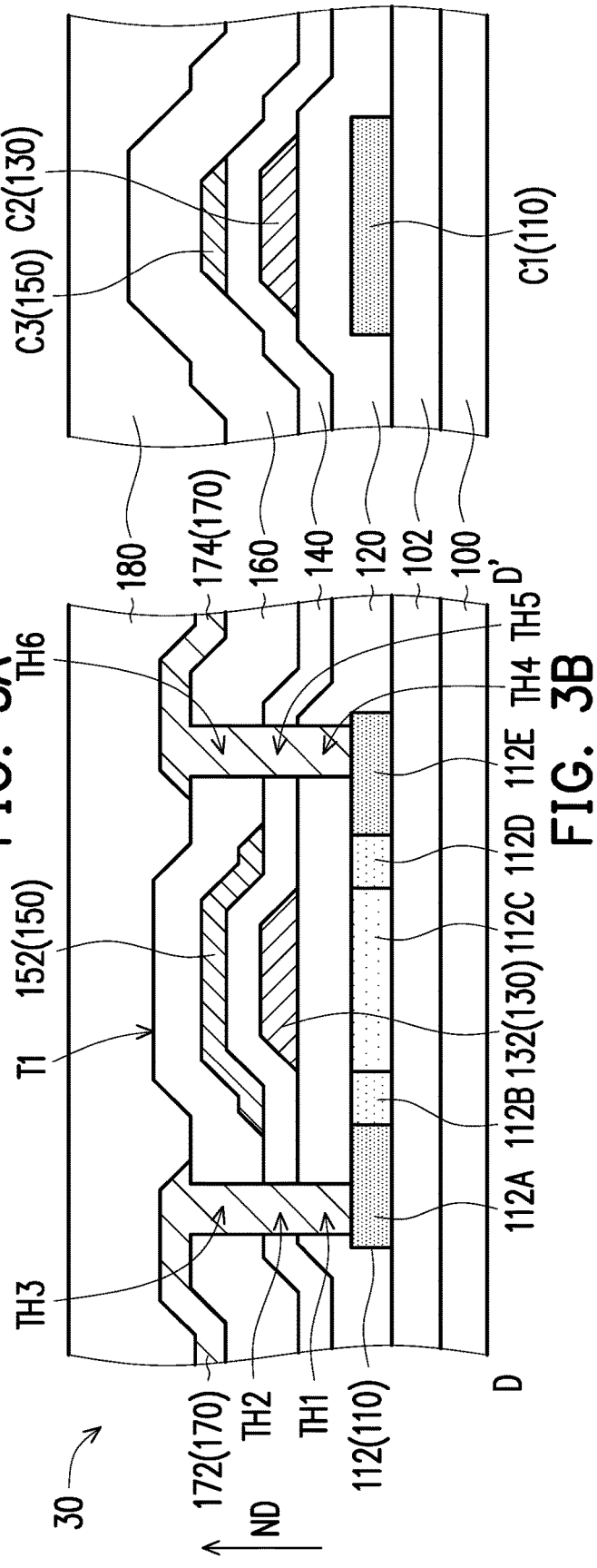
FIG. 3A
FIG. 3B

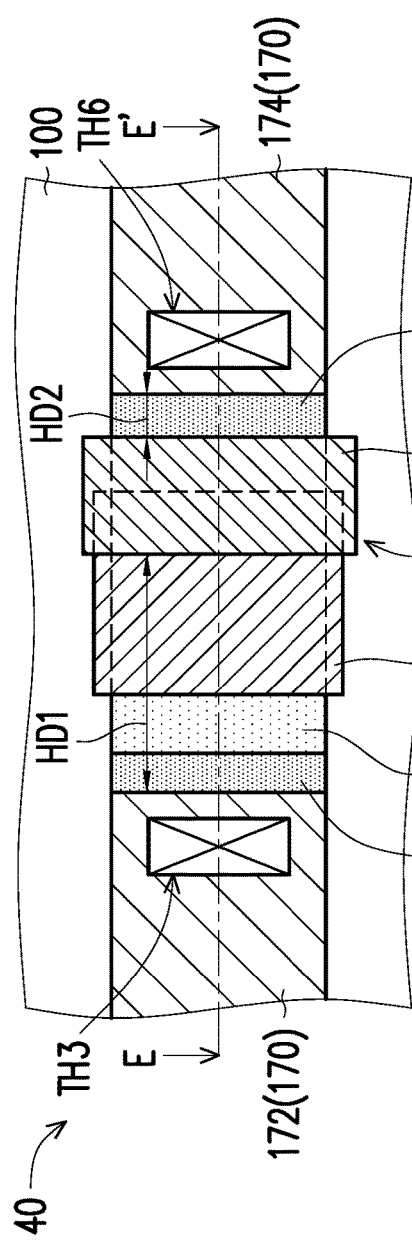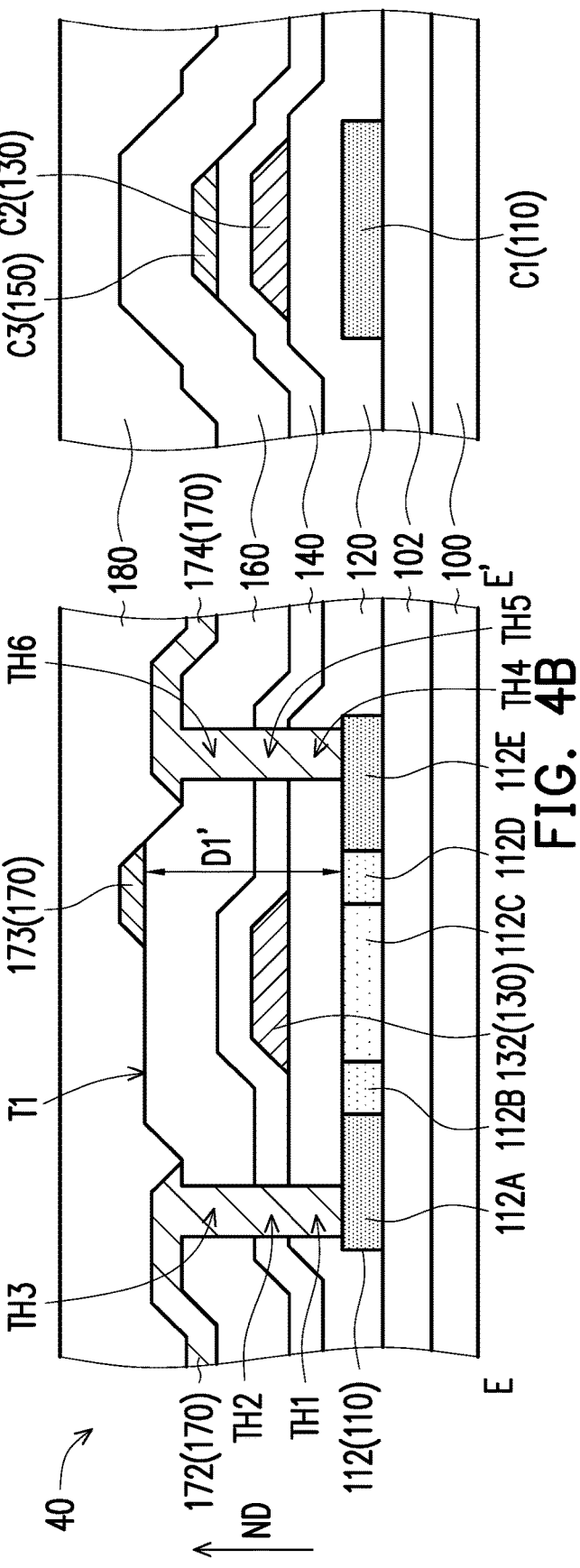
FIG. 4A
FIG. 4B

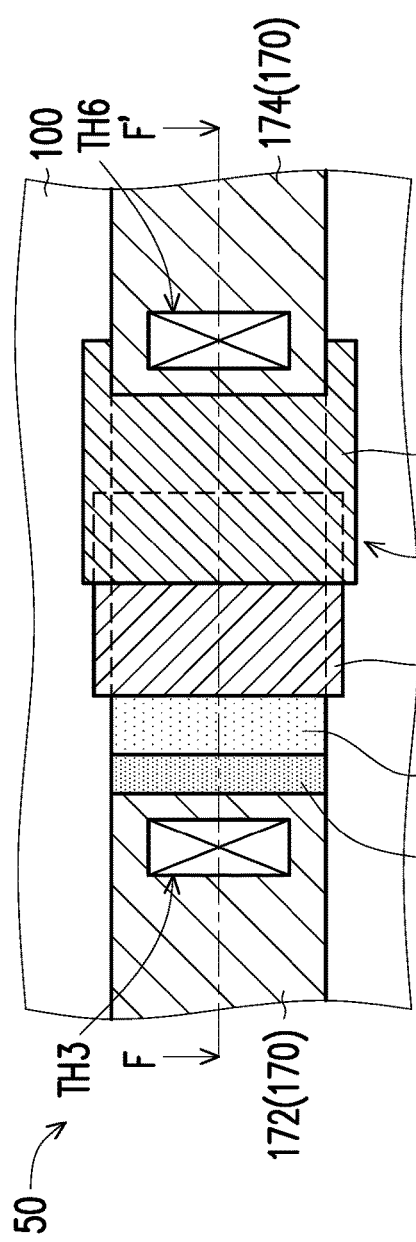
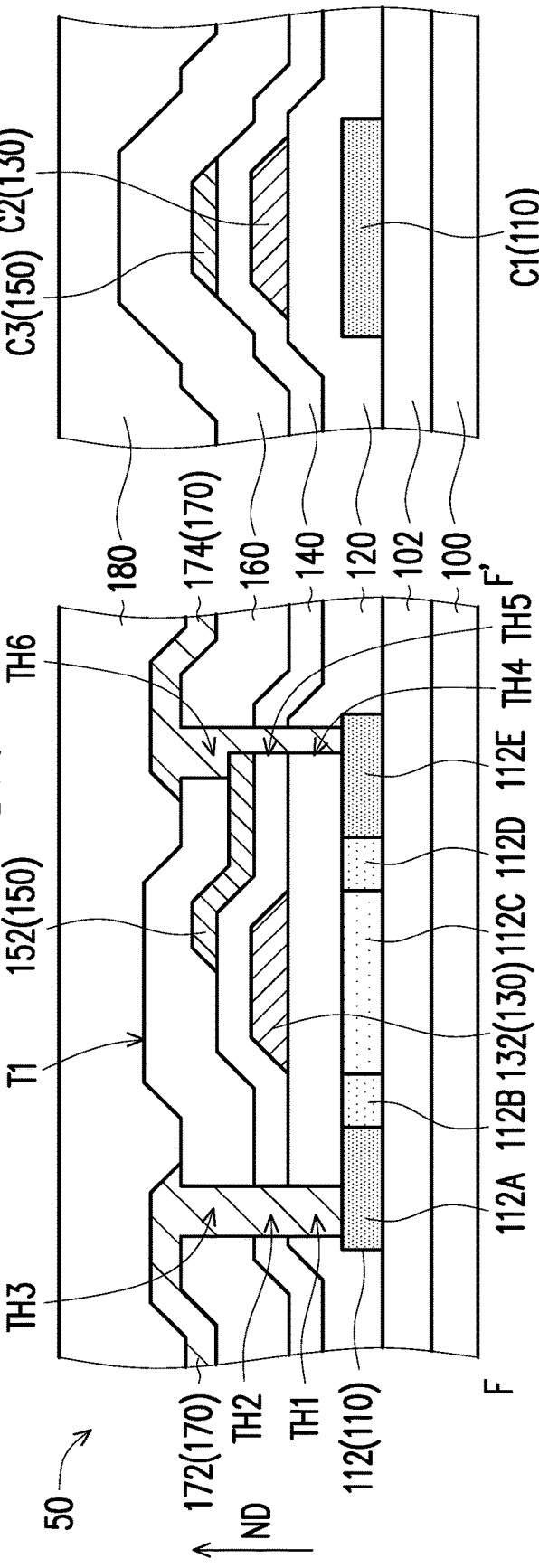
FIG. 5A
FIG. 5B

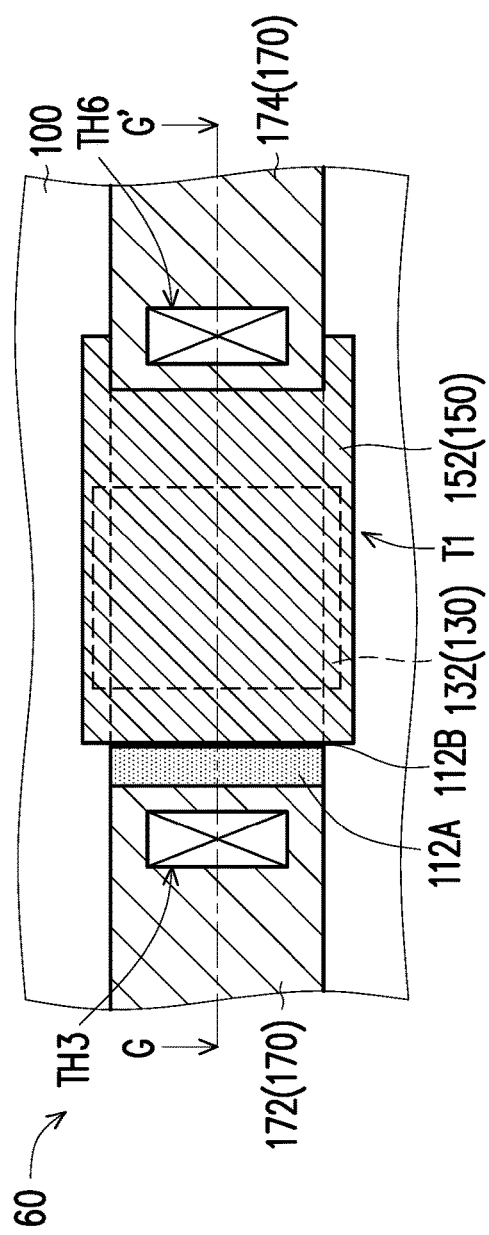
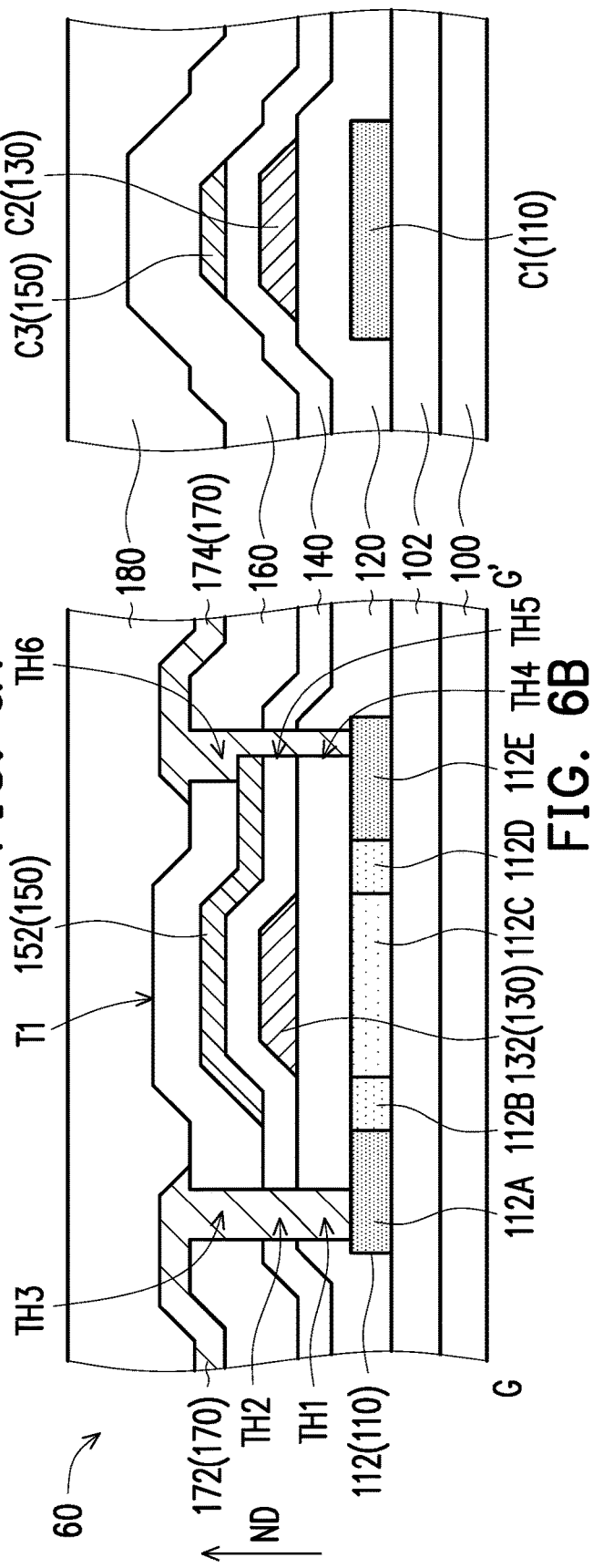
FIG. 6A
FIG. 6B

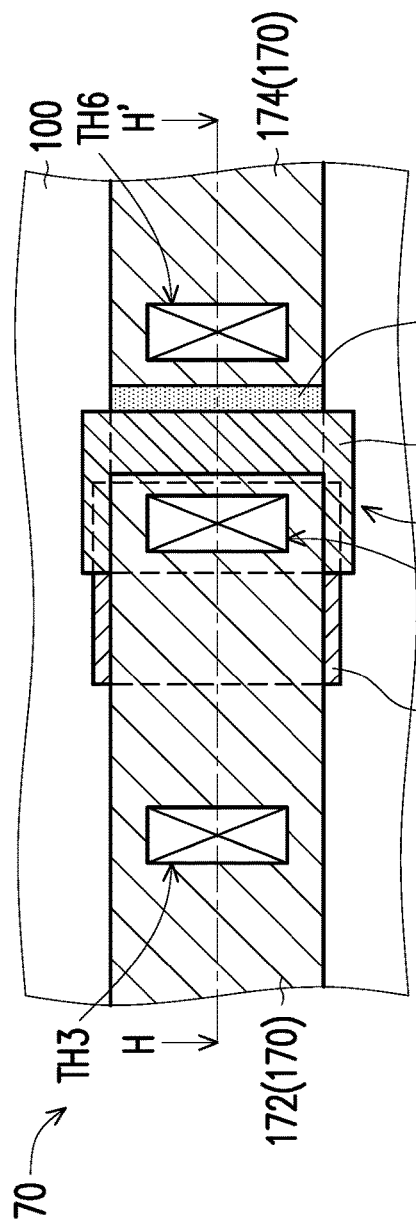
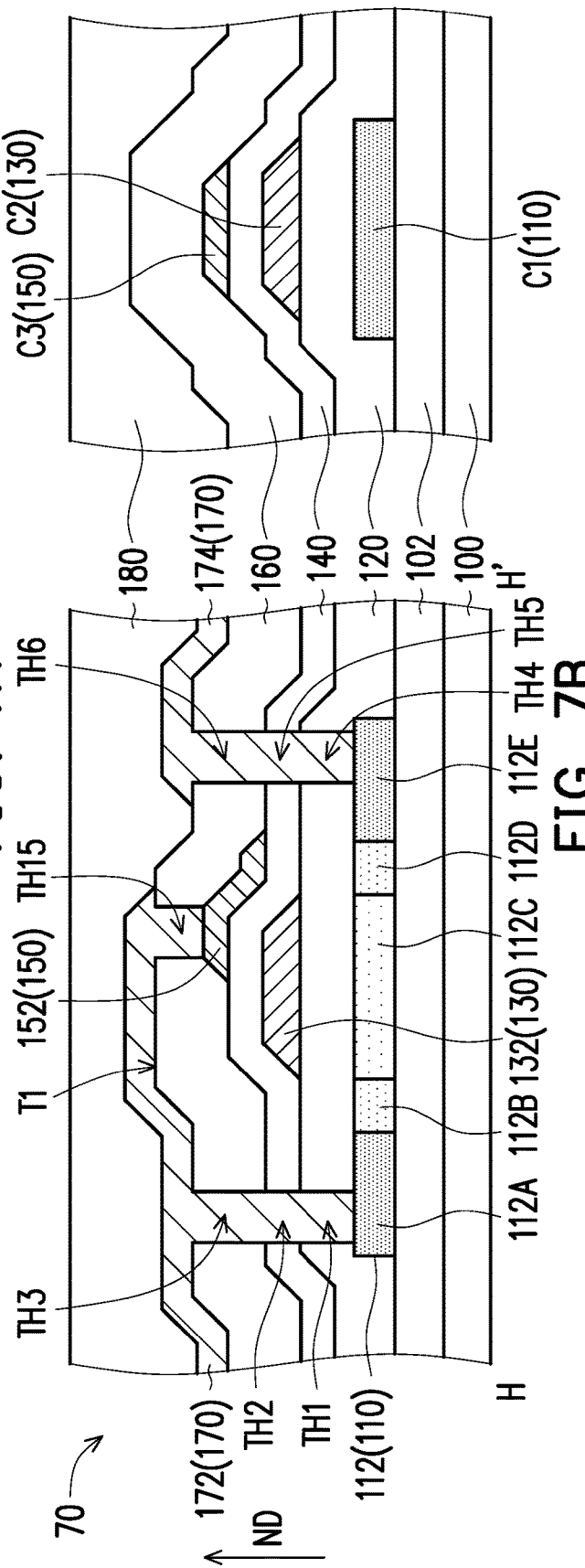
FIG. 7A
FIG. 7B

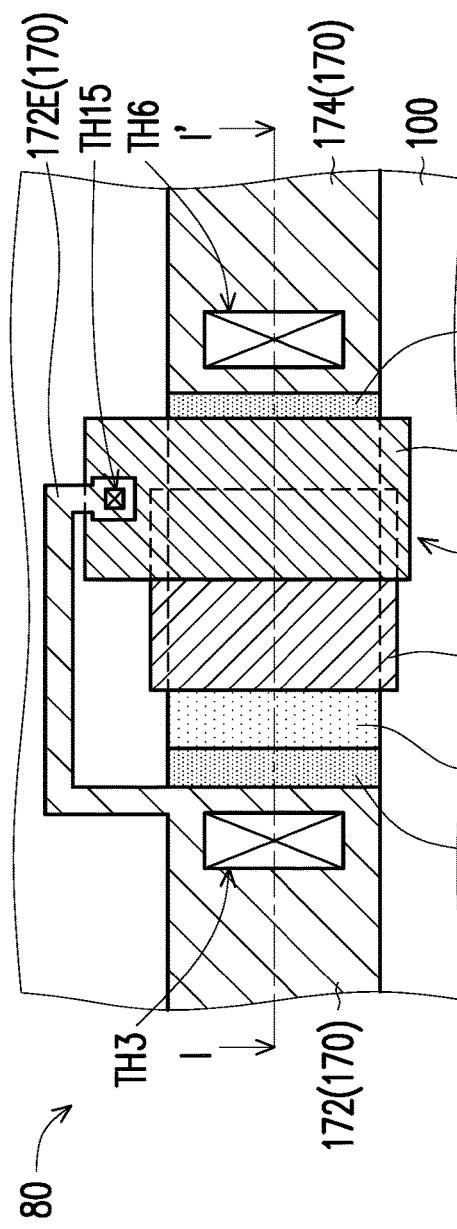
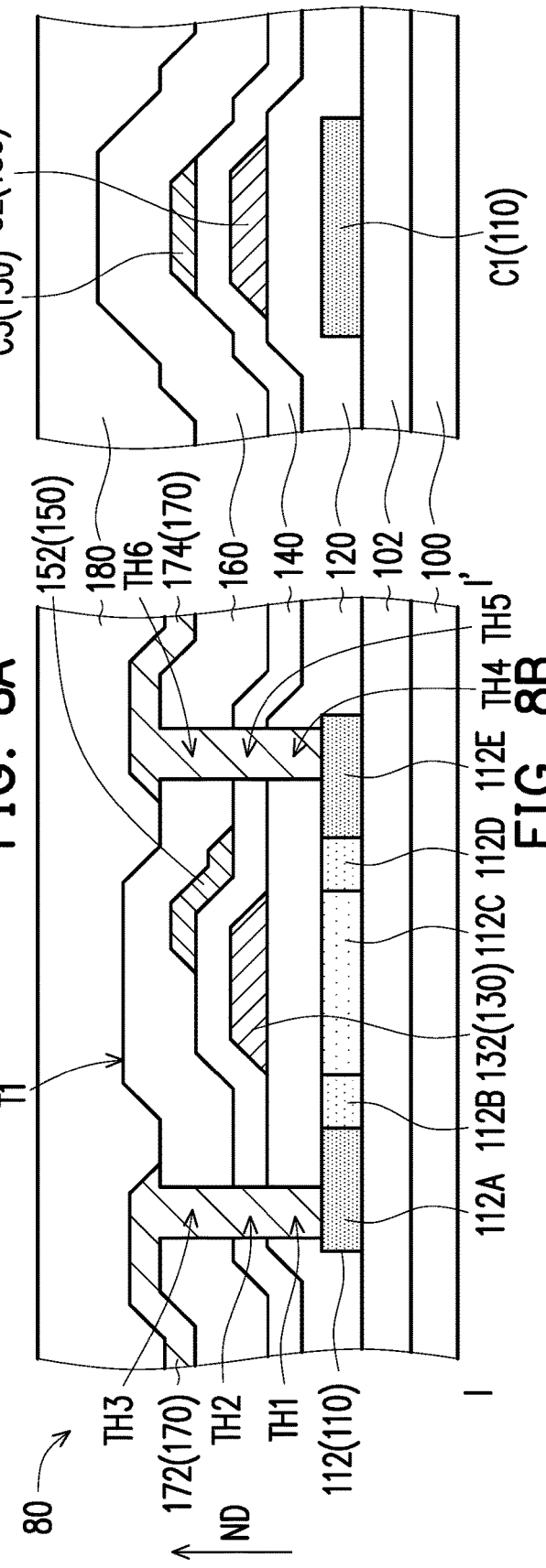

ACTIVE DEVICE SUBSTRATE

CROSS-REFERENCE TO RELATED APPLICATION

This application claims the priority benefit of Taiwan application serial no. 110125759, filed on Jul. 13, 2021. The entirety of the above-mentioned patent application is hereby incorporated by reference herein and made a part of this specification.

BACKGROUND

Technical Field

The disclosure relates to an active device substrate.

Description of Related Art

Generally speaking, electronic apparatuses contain many semiconductor devices. For example, display apparatuses often contain many thin film transistors, and these thin film transistors are formed by depositing various thin films (such as semiconductors, metals, dielectric layers, etc.) on a substrate. In the display apparatuses, the thin film transistors may be disposed in a pixel structure or in a driving circuit.

With the advancement of technology, critical dimensions of various process technologies are gradually reduced. In order to manufacture smaller thin film transistors, the distance between different electrodes of the thin film transistor is gradually reduced, which increases the negative influence of the electric field between different electrodes on the quality of the thin film transistors.

SUMMARY

The disclosure provides an active device substrate, which may improve a problem of a hot carrier effect of an active device.

At least an embodiment of the disclosure provides an active device substrate. The active device substrate includes a substrate, a first semiconductor layer, a gate insulating layer, a first gate, a first source, a first drain, and a shielding electrode. The first semiconductor layer is located on the substrate, and includes a first heavily doped region, a first lightly doped region, a channel region, a second lightly doped region, and a second heavily doped region that are sequentially connected. The gate insulating layer is located on the first semiconductor layer. The first gate is located on the gate insulating layer, and overlaps the channel region of the first semiconductor layer in a normal direction of the substrate. The first source is electrically connected to the first heavily doped region of the first semiconductor layer. The first drain is electrically connected to the second heavily doped region of the first semiconductor layer. A first active device includes the first semiconductor layer, the first gate, the first source, and the first drain. The shielding electrode overlaps the second lightly doped region of the first semiconductor layer in the normal direction of the substrate, and the shielding electrode is a floating electrode.

At least an embodiment of the disclosure provides an active device substrate. The active device substrate includes a substrate, a semiconductor pattern, a gate insulating layer, a first conductive layer, a first dielectric layer, a shielding electrode, a second dielectric layer, and a second conductive layer. The semiconductor pattern is located on the substrate, and includes a first semiconductor layer. The first semiconductor layer includes a first heavily doped region, a first lightly doped region, a channel region, a second lightly doped region, and a second heavily doped region that are sequentially connected. The gate insulating layer is formed on the semiconductor pattern. The first conductive layer is formed on the gate insulating layer, and includes a first gate. The first gate overlaps the channel region of the first semiconductor layer in a normal direction of the substrate. The first dielectric layer is formed on the first conductive layer and the gate insulating layer. The shielding electrode is formed on the first dielectric layer, and overlaps the second lightly doped region of the first semiconductor layer in the normal direction of the substrate. The second dielectric layer is formed on the first dielectric layer and the shielding electrode. The second conductive layer is formed on the second dielectric layer, and includes a first source and a first drain. The first source is electrically connected to the first heavily doped region of the first semiconductor layer. The first drain is electrically connected to the second heavily doped region of the first semiconductor layer.

Based on the above, with a disposition of the shielding electrode, an electric field between the second heavily doped region and the first gate may be dispersed by the shielding electrode. In this way, the problem of the hot carrier effect of the active device may be improved.

BRIEF DESCRIPTION OF THE DRAWINGS

FIG. 1A is a schematic top view of an active device substrate according to an embodiment of the disclosure.

FIG. 1B is a schematic cross-sectional view taken along a line A-A' of FIG. 1A.

FIG. 3A is a schematic top view of an active device substrate according to an embodiment of the disclosure.

FIG. 3B is a schematic cross-sectional view taken along a line D-D' of FIG. 3A.

FIG. 4A is a schematic top view of an active device substrate according to an embodiment of the disclosure.

FIG. 4B is a schematic cross-sectional view taken along a line E-E' of FIG. 4A.

FIG. 5A is a schematic top view of an active device substrate according to an embodiment of the disclosure.

FIG. 5B is a schematic cross-sectional view taken along a line F-F' of FIG. 5A.

FIG. 6A is a schematic top view of an active device substrate according to an embodiment of the disclosure.

FIG. 6B is a schematic cross-sectional view taken along a line G-G' of FIG. 6A.

FIG. 7A is a schematic top view of an active device substrate according to an embodiment of the disclosure.

FIG. 7B is a schematic cross-sectional view taken along a line H-H' of FIG. 7A.

FIG. 8A is a schematic top view of an active device substrate according to an embodiment of the disclosure.

FIG. 8B is a schematic cross-sectional view taken along a line I-I' of FIG. 8A.

DETAILED DESCRIPTION OF DISCLOSED EMBODIMENTS

Figure 2A:
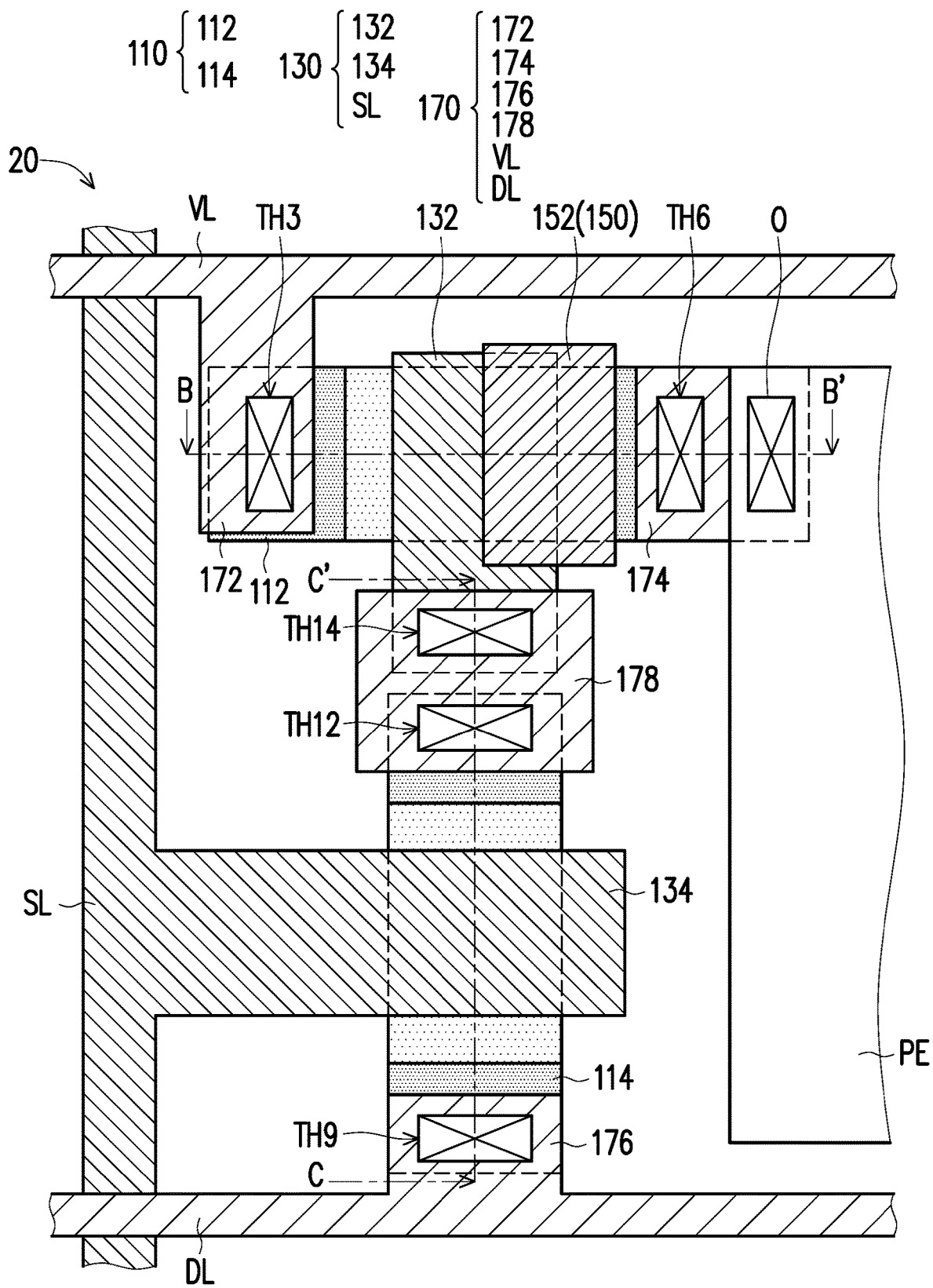
FIG. 2A is a schematic top view of an active device substrate according to an embodiment of the disclosure.

FIG. 1A is a schematic top view of an active device substrate according to an embodiment of the disclosure. FIG. 1B is a schematic cross-sectional view taken along a line A-A' of FIG. 1A.

Referring to FIGS. 1A and 1B, an active device substrate 10 includes a substrate 100, a semiconductor pattern 110, a gate insulating layer 120, a first conductive layer 130, a first dielectric layer 140, an auxiliary conductive layer 150, a second dielectric layer 160, and a second conductive layer 170. In this embodiment, a first active device T1 is located on the substrate 100, and includes a first semiconductor layer 112, a first gate 132, a first source 172, and a first drain 174.

A material of the substrate 100 includes glass, quartz, an organic polymer, or an opaque/reflective material (for example, a conductive material, metal, wafer, ceramics, or other applicable materials), or other applicable materials. A buffer layer 102 is formed on the substrate 100. The buffer layer 102 includes, for example, a single layer or multiple layers of insulating layers.

The semiconductor pattern 110 includes the first semiconductor layer 112. In this embodiment, the semiconductor pattern 110 further includes a first capacitance electrode C1. The semiconductor pattern 110 is located on the substrate 100. In some embodiments, the semiconductor pattern 110 is formed on the buffer layer 102. For example, the first semiconductor layer 112 and the first capacitance electrode C1 are directly deposited on the buffer layer 102. In some embodiments, a material of the semiconductor pattern 110 includes amorphous silicon, polycrystalline silicon, microcrystalline silicon, single crystalline silicon, an organic semiconductor material, an oxide semiconductor material (for example, indium zinc oxide, indium gallium zinc oxide, other appropriate materials, or a combination of the above), III-V compound semiconductors, other appropriate materials, or a combination of the above materials.

The first semiconductor layer 112 is a doped semiconductor layer, and includes a first heavily doped region 112A, a first lightly doped region 112B, a channel region 112C, a second lightly doped region 112D, and a second heavily doped region 112E that are sequentially connected. The channel region 112C is located between the first lightly doped region 112B and the second lightly doped region 112D. The first lightly doped region 112B is located between the first heavily doped region 112A and the channel region 112C. The second lightly doped region 112D is located between the second heavily doped region 112E and the channel region 112C. Doping concentrations of the first heavily doped region 112A and the second heavily doped region 112E are higher than doping concentrations of the first lightly doped region 112B and the second lightly doped region 112D, and the doping concentrations of the first lightly doped region 112B and the second lightly doped region 112D is higher than a doping concentration of the channel region 112C. The first semiconductor layer 112 is a P-type semiconductor or an N-type semiconductor.

The first capacitance electrode C1 is a doped semiconductor, and a doping concentration of the first capacitance electrode C1 is, for example, approximately equal to the doping concentrations of the first heavily doped region 112A and the second heavily doped region 112E.

The gate insulating layer 120 is formed on the semiconductor pattern 110. In this embodiment, the gate insulating layer 120 is formed on the first semiconductor layer 112, the first capacitance electrode C1, and the buffer layer 102. For example, the gate insulating layer 120 is directly deposited on the first semiconductor layer 112 and the buffer layer 102. A material of the gate insulating layer 120 includes, for example, an inorganic material (for example, silicon oxide, silicon nitride, silicon oxynitride, hafnium oxide, aluminum oxide, other appropriate materials, or a stacked layer of at least two of the above materials), an organic material, other appropriate materials, or a combination of the above. In this embodiment, a thickness t1 of the gate insulating layer 120 is 50 nm to 150 nm.

The first conductive layer 130 includes the first gate 132. In this embodiment, the first conductive layer 130 further includes a second capacitance electrode C2. The first conductive layer 130 is formed on the gate insulating layer 120. For example, the first gate 132 and the second capacitance electrode C2 are directly deposited on the gate insulating layer 120, and directly contact an upper surface of the gate insulating layer 120. A material of the first conductive layer 130 includes chromium, gold, silver, copper, tin, lead, hafnium, tungsten, molybdenum, neodymium, titanium, tantalum, aluminum, zinc, an alloy of the foregoing metals or a stacked layer of the foregoing metals, or other conductive materials. The first gate 132 overlaps the channel region 112C of the first semiconductor layer 112 in a normal direction ND of the substrate 100. In some embodiments, a method for forming the first lightly doped region 112B and the second lightly doped region 112D of the first semiconductor layer 112 includes performing an ion implantation process with the first gate 132 as a mask. Therefore, the first gate 132 is aligned with the channel region 112C of the first semiconductor layer 112 in the normal direction ND. In addition, a signal line connected to the first gate 132 is omitted in FIG. 1A. In some embodiments, the signal line (not shown) connected to the first gate 132 and the first gate 132 both belong to the first conductive layer 130, and the two are connected as a whole. However, the disclosure is not limited thereto. In other embodiments, the signal line (not shown) connected to the first gate 132 and the first gate 132 belong to different conductive layers, and are connected to each other through a through hole that penetrates more than one layer of the insulating layer.

The second capacitance electrode C2 overlaps the first capacitance electrode C1 in the normal direction ND of the substrate 100.

In some embodiments, in addition to the first gate 132 and the capacitance electrode C2, the first conductive layer 130 further includes other conductive structures, such as the signal line or other electrodes.

The first dielectric layer 140 is formed on the first conductive layer 130 and the gate insulating layer 120. In some embodiments, the first dielectric layer 140 is directly deposited on the first conductive layer 130 and the gate insulating layer 120, and directly contacts an upper surface of the first gate 132 and the upper surface of the gate insulating layer 120. A material of the first dielectric layer 140 includes, for example, an inorganic material (for example, silicon oxide, silicon nitride, silicon oxynitride, hafnium oxide, aluminum oxide, other appropriate materials, or a stacked layer of at least two of the above materials), an organic material, other appropriate materials, or a combination of the above. In this embodiment, a thickness t2 of the first dielectric layer 140 is 50 nm to 300 nm.

The auxiliary conductive layer 150 includes a shielding electrode 152. In this embodiment, the auxiliary conductive layer 150 further includes a third capacitance electrode C3. The auxiliary conductive layer 150 is formed on the first dielectric layer 140. For example, the shielding electrode 152 and the third capacitance electrode C3 are directly deposited on the first dielectric layer 140, and directly contact an upper surface of the first dielectric layer 140. The shielding electrode 152 overlaps the second lightly doped region 112D of the first semiconductor layer 112 in the normal direction ND of the substrate 100. In some embodiments, the shielding electrode 152 completely covers the second lightly doped region 112D in the normal direction ND of the substrate 100. In this embodiment, a vertical distance D1 between the shielding electrode 152 and the second lightly doped region 112D of the first semiconductor layer 112 is 100 nm to 450 nm. A material of the auxiliary conductive layer 150 is the same as or different from the material of the first conductive layer 130. In this embodiment, the material of the auxiliary conductive layer 150 is the same as the material of the first conductive layer 130, and includes chromium, gold, silver, copper, tin, lead, hafnium, tungsten, molybdenum, neodymium, titanium, tantalum, aluminum, zinc, an alloy of the foregoing metals or a stacked layer of the foregoing metals, or other conductive materials.

In this embodiment, the shielding electrode 152 is a floating electrode. In other words, in this embodiment, the shielding electrode 152 is not connected to the signal line, and no voltage is directly applied to the shielding electrode 152.

The third capacitance electrode C3 overlaps the first capacitance electrode C1 and the second capacitance electrode C2 in the normal direction ND of the substrate 100.

In some embodiments, in addition to the shielding electrode 152 and the third capacitance electrode C3, the auxiliary conductive layer 150 further includes other conductive structures, such as the signal line or other electrodes.

In this embodiment, the shielding electrode 152 and the third capacitance electrode C3 are formed on the same conductive layer. In this way, the number of masks required for a manufacturing process may be saved.

In this embodiment, the second dielectric layer 160 is formed on the first dielectric layer 140 and the auxiliary conductive layer 150. For example, the second dielectric layer 160 is directly deposited on the first dielectric layer 140, the shielding electrode 152, and the third capacitance electrode C3, and directly contacts the upper surface of the first dielectric layer 140, an upper surface of the shielding electrode 152, and an upper surface of the third capacitance electrode C3. A material of the second dielectric layer 160 includes, for example, an inorganic material (for example, silicon oxide, silicon nitride, silicon oxynitride, hafnium oxide, aluminum oxide, other appropriate materials, or a stacked layer of at least two of the above materials), an organic material, other appropriate materials, or a combination of the above. In this embodiment, a thickness t3 of the second dielectric layer 160 is 50 nm to 600 nm.

The second conductive layer 170 includes the first source 172 and the first drain 174. The second conductive layer 170 is formed on the second dielectric layer 160. For example, the first source 172 and the first drain 174 are directly deposited on the second dielectric layer 160, and directly contact an upper surface of the second dielectric layer 160. A material of the second conductive layer 170 is the same as or different from the material of the auxiliary conductive layer 150. In this embodiment, the materials of the second conductive layer 170 is different from the material of the auxiliary conductive layer 150, and the second conductive layer 170 includes chromium, gold, silver, copper, tin, lead, hafnium, tungsten, molybdenum, neodymium, titanium, tantalum, aluminum, zinc, an alloy of the foregoing metals or a stacked layer of the foregoing metals, or other conductive materials.

The first source 172 is electrically connected to the first heavily doped region 112A of the first semiconductor layer 112. In this embodiment, the first source 172 is electrically connected to the first heavily doped region 112A through a through hole TH1 of the gate insulating layer 120, a through hole TH2 of the first dielectric layer 140, and a through hole TH3 of the second dielectric layer 160. In this embodiment, the through hole TH1, the through hole TH2, and the through hole TH3 completely overlap one another, but the disclosure is not limited thereto. In other embodiments, the through hole TH1, the through hole TH2, and the through hole TH3 may partially overlap one another.

The first drain 174 is electrically connected to the second heavily doped region 112E of the first semiconductor layer 112. In this embodiment, the first drain 174 is electrically connected to the first heavily doped region 112E through a through hole TH4 of the gate insulating layer 120, a through hole TH5 of the first dielectric layer 140, and a through hole TH6 of the second dielectric layer 160. In this embodiment, the through hole TH4, the through hole TH5, and the through hole TH6 completely overlap one another, but the disclosure is not limited thereto. In other embodiments, the through hole TH4, the through hole TH5, and the through hole TH6 may partially overlap one another.

In this embodiment, when the voltage is applied to the first gate 132 and the first drain 174, an electric field is formed between the first heavily doped region 112E and the first gate 132 (as shown by a dashed line arrow in the figure). In this embodiment, the shielding electrode 152 may be used to disperse the electric field between the first heavily doped region 112E and the first gate 132, so that the electric field between the first heavily doped region 112E and the first gate 132 is reduced. In this way, an influence of a hot carrier effect on the first active device T1 is improved, and the first active device T1 is prevented from being degraded due to the hot carrier effect. In some embodiments, whether the first active device T1 is a P-type thin film transistor or an N-type thin film transistor, the shielding electrode 152 may be used to disperse the electric field between the semiconductor layer and the gate. In this way, the influence of the hot carrier effect on the first active device T1 is improved.

A passivation layer 180 is formed on the second conductive layer 170, and covers the first active device T1.

Based on the above, with a disposition of the shielding electrode 152, the hot carrier effect of the first active device T1 may be reduced. In this way, a degradation problem of the first active device T1 is improved. In addition, by forming the shielding electrode 152 and the third capacitance electrode C3 on the same conductive layer, the manufacturing cost of the apparatus may be saved.

Figure 2B:
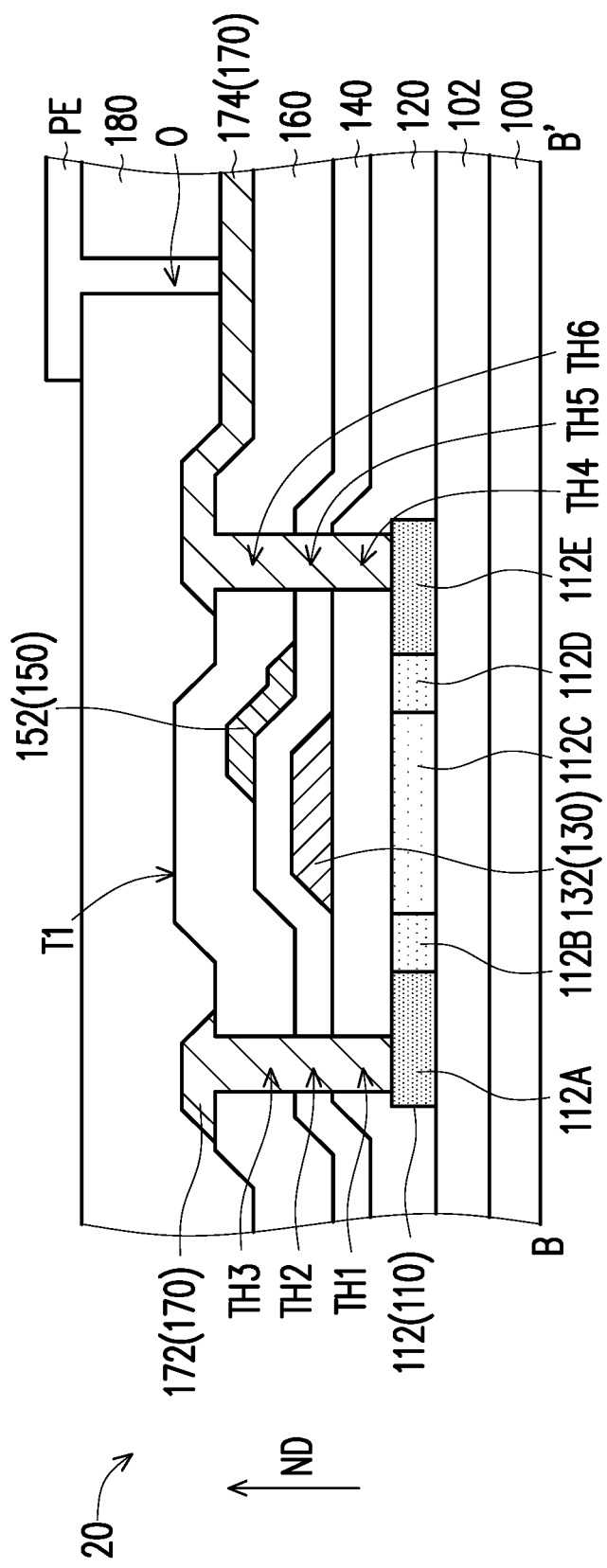
FIG. 2B is a schematic cross-sectional view taken along a line B-B' of FIG. 2A.
Figure 2C:
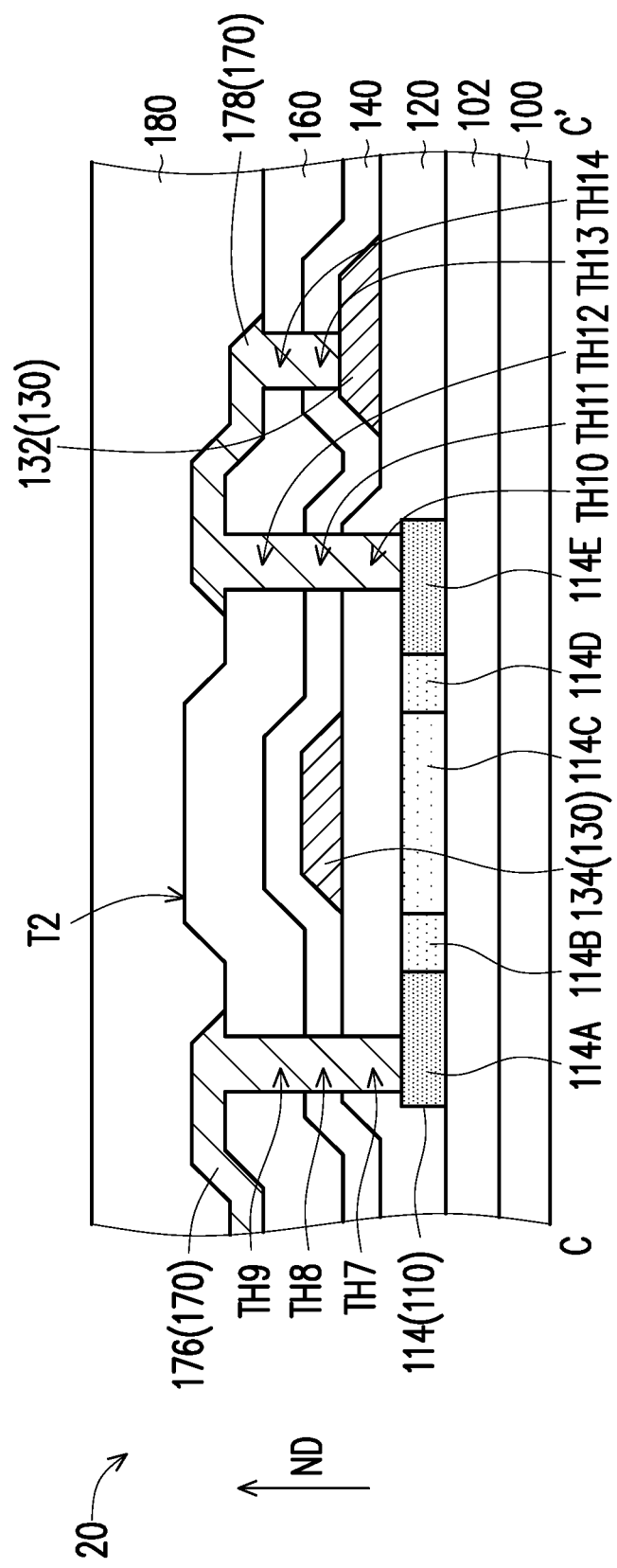
FIG. 2C is a schematic cross-sectional view taken along a line C-C' of FIG. 2A.

FIG. 2A is a schematic top view of an active device substrate according to an embodiment of the disclosure. FIG. 2B is a schematic cross-sectional view taken along a line B-B' of FIG. 2A. FIG. 2C is a schematic cross-sectional view taken along a line C-C' of FIG. 2A.

It is noted that some of the reference numerals and descriptions of the embodiment of FIGS. 1A and 1B will apply to the embodiment of FIGS. 2A to 2C. The same or similar reference numerals will represent the same or similar components and the descriptions of the same technical contents will be omitted. Reference may be made to the above embodiment for the omitted descriptions, which will not be repeated in the following embodiments.

Referring to FIG. 2A to 2C, in this embodiment, an active device substrate 20 includes the substrate 100, the semiconductor pattern 110, the gate insulating layer 120, the first conductive layer 130, the first dielectric layer 140, the auxiliary conductive layer 150, the second dielectric layer 160, and the second conductive layer 170. In this embodiment, the first active device T1 and a second active device T2 are located on the substrate 100. The first active device T1 includes the first semiconductor layer 112, the first gate 132, the first source 172, and the first drain 174. The second active device T2 includes a second semiconductor layer 114, a second gate 134, a second source 176, and a second drain 178.

In this embodiment, the semiconductor pattern 110 includes the first semiconductor layer 112 and the second semiconductor layer 114.

The second semiconductor layer 114 is a doped semiconductor layer, and includes a first heavily doped region 114A, a first lightly doped region 114B, a channel region 114C, a second lightly doped region 114D, and a second heavily doped region 114E that are sequentially connected. The channel region 114C is located between the first lightly doped region 114B and the second lightly doped region 114D. The first lightly doped region 114B is located between the first heavily doped region 114A and the channel region 114C. The second lightly doped region 114D is located between the second heavily doped region 114E and the channel region 114C. Doping concentrations of the first heavily doped region 114A and the second heavily doped region 114E is higher than doping concentrations of the first lightly doped region 114B and the second lightly doped region 114D, and the doping concentrations of the first lightly doped region 114B and the second lightly doped region 114D is higher than a doping concentration of the channel region 114C. The first semiconductor layer 114 is the P-type semiconductor or the N-type semiconductor.

Although in this embodiment, the first semiconductor layer 112 and the second semiconductor layer 114 belong to the same film layer (which both belong to the semiconductor pattern 110), and are formed at the same time. However, the disclosure is not limited thereto. In other embodiments, the first semiconductor layer 112 and the second semiconductor layer 114 include different materials, and the first semiconductor layer 112 and the second semiconductor layer 114 belong to different film layers (that is, the semiconductor pattern 110 includes the first semiconductor layer 112, but the semiconductor pattern 110 does not include the second semiconductor layer 114; in other words, the first semiconductor layer 112 and the second semiconductor layer 114 may be formed by different patterning processes).

The first conductive layer 130 includes the first gate 132 and the second gate 134. The second gate 134 overlaps the second semiconductor layer 114 in the normal direction ND of the substrate 100. In some embodiments, a method for forming the first lightly doped region 114B and the second lightly doped region 114D of the second semiconductor layer 114 includes performing the ion implantation process with the second gate 134 as the mask. Therefore, the second gate 134 is aligned with the channel region 114C of the second semiconductor layer 114 in the normal direction ND.

In this embodiment, the first conductive layer 130 also includes a scanning line SL. The scanning line SL is connected to the second gate 134.

The second conductive layer 170 includes the first source 172, the first drain 174, the second source 176, and the second drain 178.

The second source 176 is electrically connected to the first heavily doped region 114A of the second semiconductor layer 114. In this embodiment, the second source 176 is electrically connected to the first heavily doped region 114A through a through hole TH7 of the gate insulating layer 120, a through hole TH8 of the first dielectric layer 140, and a through hole TH9 of the second dielectric layer 160. In this embodiment, the through hole TH7, the through hole TH8, and the through hole TH9 completely overlap one another, but the disclosure is not limited thereto. In other embodiments, the through hole TH7, the through hole TH8, and the through hole TH9 may partially overlap one another.

The second drain 178 is electrically connected to the second heavily doped region 114E of the second semiconductor layer 114. In this embodiment, the second drain 178 is electrically connected to the first heavily doped region 114E through a through hole TH10 of the gate insulating layer 120, a through hole TH11 of the first dielectric layer 140, and a through hole TH12 of the second dielectric layer 160. In this embodiment, the through hole TH10, the through hole TH11, and the through hole TH12 completely overlap one another, but the disclosure is not limited thereto. In other embodiments, the through hole TH10, the through hole TH11, and the through hole TH12 may partially overlap one another.

The second drain 178 is electrically connected to the first gate 132. For example, the second drain 178 is electrically connected to the first gate 132 through a through hole TH13 of the first dielectric layer 140 and a through hole TH14 of the second dielectric layer 160. In this embodiment, the through hole TH13 and the through hole TH14 completely overlap each other, but the disclosure is not limited thereto. In other embodiments, the through hole TH13 and the through hole TH14 may partially overlap each other.

In this embodiment, the second conductive layer 170 further includes a data line DL and a signal line VL. The data line DL is connected to the second source 176, and the signal line VL is connected to the first source 172.

The passivation layer 180 is formed on the second conductive layer 170, and covers the first active device T1 and the second active device T2.

An electrode PE is located on the passivation layer 180, and is electrically connected to the first drain 174 of the first active device T1 through an opening O of the passivation layer 180. The electrode PE may be, for example, used to control a liquid crystal, a light emitting diode, a photosensitive device, or other electronic devices.

In this embodiment, the shielding electrode 152 overlaps the second lightly doped region 112D of the first semiconductor layer 112 and the first gate 132 in the normal direction ND of the substrate 100. A part of the first gate 132 is located between the shielding electrode 152 and the first semiconductor layer 112. Therefore, the shielding electrode 152 may not only improve the influence of the hot carrier effect on the first active device T1, but also may be used to increase a capacitance in the first active device T1.

FIG. 3A is a schematic top view of an active device substrate according to an embodiment of the disclosure. FIG. 3B is a schematic cross-sectional view taken along a line D-D' of FIG. 3A.

It is noted that some of the reference numerals and descriptions of the embodiment of FIGS. 1A and 1B will apply to the embodiment of FIGS. 3A and 3B. The same or similar reference numerals will represent the same or similar components and the descriptions of the same technical contents will be omitted. Reference may be made to the above embodiment for the omitted descriptions, which will not be repeated in the following embodiments.

Referring to FIGS. 3A and 3B, the shielding electrode 152 of an active device substrate 30 overlaps the first lightly doped region 112B, the channel region 112C, the second lightly doped region 112D of the first semiconductor layer 112, and the gate 132 in the normal direction ND of the substrate 100. In this embodiment, the shielding electrode 152 may not only improve the influence of the hot carrier effect on the first active device T1, but also may be used to increase the capacitance in the first active device T1 (which is a capacitance between the shielding electrode 152 and the first gate 132).

In this embodiment, the shielding electrode 152 extends from above the second lightly doped region 112D to above the first lightly doped region 112B. In this way, an overlap area between the shielding electrode 152 and the first gate 132 is increased. Based on this, the capacitance between the shielding electrode 152 and the first gate 132 may be improved.

FIG. 4A is a schematic top view of an active device substrate according to an embodiment of the disclosure. FIG. 4B is a schematic cross-sectional view taken along a line E-E' of FIG. 4A.

It is noted that some of the reference numerals and descriptions of the embodiment of FIGS. 1A and 1B will apply to the embodiment of FIGS. 4A and 4B. The same or similar reference numerals will represent the same or similar components and the descriptions of the same technical contents will be omitted. Reference may be made to the above embodiment for the omitted descriptions, which will not be repeated in the following embodiments.

Referring to FIGS. 4A and 4B, in an active device substrate 40, the second conductive layer 170 includes a shielding electrode 173, and the second conductive layer 170 is formed on the second dielectric layer 160. For example, the first source 172, the shielding electrode 173, and the first drain 174 are directly deposited on the second dielectric layer 160, and directly contact the upper surface of the second dielectric layer 160. The material of the second conductive layer 170 is the same as or different from the material of the first conductive layer 130. The first source 172, the shielding electrode 173, and the first drain 174 are the same conductive layer, and are formed at the same time. The shielding electrode 173 is separated from the first source 172 and the first drain 174. The shielding electrode 173 is located between the first source 172 and the first drain 174. A horizontal spacing HD1 between the shielding electrode 173 and the first source 172 depends on an exposure limit (or referred to as a critical dimension (CD)) of a tool used during the patterning process. For example, the horizontal spacing HD1 is greater than or equal to a sum of the exposure limit and a length of the channel region 112C, and a horizontal spacing HD2 between the shielding electrode 173 and the first drain 174 is greater than or equal to the exposure limit.

The shielding electrode 173 overlaps the second lightly doped region 112D of the first semiconductor layer 112 in the normal direction ND of the substrate 100. In some embodiments, the shielding electrode 173 completely covers the second lightly doped region 112D in the normal direction ND of the substrate 100. In this embodiment, a vertical distance D1' between the shielding electrode 173 and the second lightly doped region 112D of the first semiconductor layer 112 is 100 nm to 1000 nm. In this embodiment, the shielding electrode 173 is a floating electrode. In other words, in this embodiment, the shielding electrode 173 is not connected to other signal lines, and no voltage is directly applied to the shielding electrode 173.

Based on the above, with the disposition of the shielding electrode 173, the hot carrier effect of the first active device T1 may be reduced. In this way, the degradation problem of the first active device T1 is improved. In addition, by forming the first source 172, the shielding electrode 173, and the first drain 174 on the same conductive layer, the number of the masks required for the manufacturing process may be saved.

FIG. 5A is a schematic top view of an active device substrate according to an embodiment of the disclosure. FIG. 5B is a schematic cross-sectional view taken along a line F-F' of FIG. 5A.

It is noted that some of the reference numerals and descriptions of the embodiment of FIGS. 1A and 1B will apply to the embodiment of FIGS. 5A and 5B. The same or similar reference numerals will represent the same or similar components and the descriptions of the same technical contents will be omitted. Reference may be made to the above embodiment for the omitted descriptions, which will not be repeated in the following embodiments.

Referring to FIGS. 5A and 5B, in an active device substrate 50, the shielding electrode 152 is electrically connected to the first drain 174.

The first drain 174 is electrically connected to the first heavily doped region 112E through the through hole TH4 of the gate insulating layer 120, the through hole TH5 of the first dielectric layer 140, and the through hole TH6 of the second dielectric layer 160 that are sequentially connected. In this embodiment, the through hole TH6 overlaps the through hole TH5 and the through hole TH4 in the normal direction ND of the substrate 100, and a size of the through hole TH6 is larger than a size of the through hole TH5 and a size of the through hole TH4.

In some embodiments, a part of the shielding electrode 152 is located between the first dielectric layer 140 and the through hole TH6. In some embodiments, a method of forming the through hole TH4, the through hole TH5, and the through hole TH6 is, for example, forming a mask layer on the second dielectric layer 160. The mask layer has an opening with a size corresponding to the through hole TH6, and the opening partially overlaps the shielding electrode 152. Based on the opening, the second dielectric layer 160, the first dielectric layer 140, and the gate insulating layer 120 are etched. The shielding electrode 152 may protect the first dielectric layer 140 and the gate insulating layer 120 that are underneath the shielding electrode 152. Therefore, the size of the through hole TH6 of the second dielectric layer 160 formed by an etching process is larger than the size of the through hole TH5 of the first dielectric layer 140 and the size of the through hole TH4 of the gate insulating layer 120.

Based on the above, with the disposition of the shielding electrode 152, the hot carrier effect of the first active device T1 may be reduced. In this way, the degradation problem of the first active device T1 is improved.

FIG. 6A is a schematic top view of an active device substrate according to an embodiment of the disclosure. FIG. 6B is a schematic cross-sectional view taken along a line G-G' of FIG. 6A.

It is noted that some of the reference numerals and descriptions of the embodiment of FIGS. 5A and 5B will apply to the embodiment of FIGS. 6A and 6B. The same or similar reference numerals will represent the same or similar components and the descriptions of the same technical contents will be omitted. Reference may be made to the above embodiment for the omitted descriptions, which will not be repeated in the following embodiments.

Referring to FIGS. 6A and 6B, the shielding electrode 152 of an active device substrate 60 overlaps the first lightly doped region 112B, the channel region 112C, the second lightly doped region 112D of the first semiconductor layer 112, and the gate 132 in the normal direction ND of the substrate 100. In this embodiment, the shielding electrode 152 may not only improve the influence of the hot carrier effect on the first active device T1, but also may be used to increase the capacitance in the first active device T1.

In this embodiment, the shielding electrode 152 extends from above the second lightly doped region 112D to above the first lightly doped region 112B. In this way, the overlap area between the shielding electrode 152 and the first gate 132 is increased. Based on this, the capacitance between the shielding electrode 152 and the first gate 132 may be improved.

FIG. 7A is a schematic top view of an active device substrate according to an embodiment of the disclosure. FIG. 7B is a schematic cross-sectional view taken along a line H-H' of FIG. 7A.

It is noted that some of the reference numerals and descriptions of the embodiment of FIGS. 1A and 1B will apply to the embodiment of FIGS. 7A and 7B. The same or similar reference numerals will represent the same or similar components and the descriptions of the same technical contents will be omitted. Reference may be made to the above embodiment for the omitted descriptions, which will not be repeated in the following embodiments.

Referring to FIGS. 7A and 7B, in an active device substrate 70, the shielding electrode 152 is electrically connected to the first source 172.

The gate insulating layer 120 has the through hole TH1. The first dielectric layer 140 has the through hole TH2. The second dielectric layer 160 has the through hole TH3. The first source 172 is electrically connected to the first heavily doped region 112A through the through hole TH1 of the gate insulating layer 120, the through hole TH2 of the first dielectric layer 140, and the through hole TH3 of the second dielectric layer 160 that are sequentially connected. In addition, the first source 172 is electrically connected to the shielding electrode 152 through a through hole TH15 of the second dielectric layer 160.

In this embodiment, the first source 172 overlaps the first lightly doped region 112B, the channel region 112C, and the second lightly doped region 112D in the normal direction ND of the substrate 100.

Based on the above, with the disposition of the shielding electrode 152, the hot carrier effect of the first active device T1 may be reduced. In this way, the degradation problem of the first active device T1 is improved. In addition, by forming the shielding electrode 152 and the third capacitance electrode C3 on the same conductive layer, the manufacturing cost of the apparatus may be saved.

FIG. 8A is a schematic top view of an active device substrate according to an embodiment of the disclosure. FIG. 8B is a schematic cross-sectional view taken along a line I-I' of FIG. 8A.

It is noted that some of the reference numerals and descriptions of the embodiment of FIGS. 7A and 7B will apply to the embodiment of FIGS. 8A and 8B. The same or similar reference numerals will represent the same or similar components and the descriptions of the same technical contents will be omitted. Reference may be made to the above embodiment for the omitted descriptions, which will not be repeated in the following embodiments.

Referring to FIGS. 8A and 8B, in an active device substrate 80, the shielding electrode 152 is electrically connected to the first source 172.

In this embodiment, the first source 172 has an extending portion 172E that bypasses the first lightly doped region 112B and the channel region 112C. The extending portion 172E of the first source 172 is connected to the shielding electrode 152, so that the first source 172 does not overlap the first lightly doped region 112B and the channel region 112C in the normal direction ND of the substrate 100.

With a design of the extending portion 172E, a parasitic capacitance between the first source 172 and the first gate 132 may be reduced.

Based on the above, with the disposition of the shielding electrode 152, the hot carrier effect of the first active device T1 may be reduced. In this way, the degradation problem of the first active device T1 is improved. In addition, by forming the shielding electrode 152 and the third capacitance electrode C3 on the same conductive layer, the manufacturing cost of the apparatus may be saved.

What is claimed is:

1. An active device substrate, comprising:
    a substrate;
    a semiconductor pattern located on the substrate, and comprising a first semiconductor layer, wherein the first semiconductor layer comprises a first heavily doped region, a first lightly doped region, a channel region, a second lightly doped region, and a second heavily doped region that are sequentially connected;
    a gate insulating layer formed on the semiconductor pattern;
    a first conductive layer formed on the gate insulating layer, and comprising a first gate, wherein the first gate overlaps the channel region of the first semiconductor layer in a normal direction of the substrate;
    a first dielectric layer formed on the first conductive layer and the gate insulating layer;
    a shielding electrode formed on the first dielectric layer, and overlapping the second lightly doped region of the first semiconductor layer in the normal direction of the substrate;
    a second dielectric layer formed on the first dielectric layer and the shielding electrode; and
    a second conductive layer formed on the second dielectric layer and comprising:
        a first source electrically connected to the first heavily doped region of the first semiconductor layer; and
        a first drain electrically connected to the second heavily doped region of the first semiconductor layer, wherein the gate insulating layer has a first through hole, the first dielectric layer has a second through hole, and the second dielectric layer has a third through hole, wherein the first drain is electrically connected to the second heavily doped region of the first semiconductor layer through the first through hole, the second through hole, and the third through hole that are sequentially connected, wherein the third through hole overlaps the second through hole and the first through hole in the normal direction of the substrate, and a size of the third through hole is larger than a size of the second through hole and a size of the first through hole, wherein a part of the shielding electrode is located between the first dielectric layer and the third through hole.

2. The active device substrate according to claim 1, wherein the shielding electrode is electrically connected to the first drain.

3. The active device substrate according to claim 1, wherein
    the semiconductor pattern further comprises a second semiconductor layer;
    the first conductive layer further comprises a second gate, and the second gate overlaps the second semiconductor layer in the normal direction of the substrate;

the second conductive layer further comprises:
a second source and a second drain electrically connected to the second semiconductor layer, wherein the second drain is electrically connected to the first gate.

4. The active device substrate according to claim 1, wherein the shielding electrode is physically connected to a portion of a top surface of the first drain and a portion of a sidewall of the first drain.

5. The active device substrate according to claim 1, wherein the shielding electrode is overlapping with the second lightly doped region of the first semiconductor layer and one part of the first gate in the normal direction of the substrate and is not overlapping with the first lightly doped region of the first semiconductor layer and another part of the first gate in the normal direction of the substrate.

6. The active device substrate according to claim 1, wherein the shielding electrode is near the first drain and far away from the first source.

7. An active device substrate, comprising:
a substrate;
a semiconductor pattern located on the substrate, and comprising a first semiconductor layer, wherein the first semiconductor layer comprises a first heavily doped region, a first lightly doped region, a channel region, a second lightly doped region, and a second heavily doped region that are sequentially connected;
a gate insulating layer formed on the semiconductor pattern;
a first conductive layer formed on the gate insulating layer, and comprising a first gate, wherein the first gate overlaps the channel region of the first semiconductor layer in a normal direction of the substrate;
a first dielectric layer formed on the first conductive layer and the gate insulating layer;
a shielding electrode formed on the first dielectric layer, and overlapping the second lightly doped region of the first semiconductor layer in the normal direction of the substrate;
a second dielectric layer formed on the first dielectric layer and the shielding electrode; and
a second conductive layer formed on the second dielectric layer and comprising:
a first source electrically connected to the first heavily doped region of the first semiconductor layer; and
a first drain electrically connected to the second heavily doped region of the first semiconductor layer, wherein the first drain is physically connected to a portion of a top surface of the shielding electrode and a portion of a sidewall of the shielding electrode.

8. The active device substrate according to claim 7, wherein the gate insulating layer has a first through hole, the first dielectric layer has a second through hole, and the second dielectric layer has a third through hole, wherein the first drain is electrically connected to the second heavily doped region of the first semiconductor layer through the first through hole, the second through hole, and the third through hole that are sequentially connected.

9. The active device substrate according to claim 8, wherein a part of the shielding electrode is located between the first dielectric layer and the third through hole.

10. The active device substrate according to claim 7, wherein the shielding electrode is overlapping with a part of the first gate in the normal direction of the substrate and is not overlapping with the first lightly doped region of the first semiconductor layer and another part of the first gate in the normal direction of the substrate, wherein the shielding electrode is near the first drain and far away from the first source.

11. The active device substrate according to claim 7, wherein a layer of the shielding electrode is different from the first conductive layer and the second conductive layer.

12. An active device substrate, comprising:
a substrate;
a semiconductor pattern located on the substrate, and comprising a first semiconductor layer, wherein the first semiconductor layer comprises a first heavily doped region, a first lightly doped region, a channel region, a second lightly doped region, and a second heavily doped region that are sequentially connected;
a gate insulating layer formed on the semiconductor pattern;
a first conductive layer formed on the gate insulating layer, and comprising a first gate, wherein the first gate overlaps the channel region of the first semiconductor layer in a normal direction of the substrate;
a first dielectric layer formed on the first conductive layer and the gate insulating layer;
a shielding electrode formed on the first dielectric layer, and overlapping the second lightly doped region of the first semiconductor layer in the normal direction of the substrate;
a second dielectric layer formed on the first dielectric layer and the shielding electrode; and
a second conductive layer formed on the second dielectric layer and comprising:
a first source electrically connected to the first heavily doped region of the first semiconductor layer; and
a first drain electrically connected to the second heavily doped region of the first semiconductor layer, wherein a distance between the shielding electrode and the first drain is smaller than a distance between the shielding electrode and the first source in a direction perpendicular to the normal direction of the substrate, and wherein the shielding electrode is overlapping with a part of the first gate in the normal direction of the substrate and is not overlapping with another part of the first gate in the normal direction of the substrate.

13. The active device substrate according to claim 12, wherein the shielding electrode is not overlapping with the first lightly doped region of the first semiconductor layer.

14. The active device substrate according to claim 12, wherein the gate insulating layer has a first through hole, the first dielectric layer has a second through hole, and the second dielectric layer has a third through hole, wherein the first drain is electrically connected to the second heavily doped region of the first semiconductor layer through the first through hole, the second through hole, and the third through hole that are sequentially connected.

15. The active device substrate according to claim 14, wherein a part of the shielding electrode is located between the first dielectric layer and the third through hole.

16. The active device substrate according to claim 12, wherein a layer of the shielding electrode is different from the first conductive layer and the second conductive layer.

17. The active device substrate according to claim 12, wherein the first drain is connected to a portion of a top surface of the shielding electrode and a portion of a sidewall of the shielding electrode.

* * * * *